US011170292B2

(12) United States Patent
Seo et al.

(10) Patent No.: US 11,170,292 B2
(45) Date of Patent: Nov. 9, 2021

(54) STATIC RANDOM-ACCESS MEMORY FOR DEEP NEURAL NETWORKS

(71) Applicants: Arizona Board of Regents on behalf of Arizona State University, Scottsdale, AZ (US); The Trustees of Columbia University in the City of New York, New York, NY (US)

(72) Inventors: Jae-sun Seo, Tempe, AZ (US); Shihui Yin, Mesa, AZ (US); Zhewei Jiang, New York, NY (US); Mingoo Seok, New York, NY (US)

(73) Assignees: The Trustees of Columbia University in the City of New York, New York, NY (US); Arizona Board of Regents on Behalf of Arizona State University, Scottsdale, AZ (US)

( * ) Notice: Subject to any disclaimer, the term of this patent is extended or adjusted under 35 U.S.C. 154(b) by 412 days.

(21) Appl. No.: 16/138,127

(22) Filed: Sep. 21, 2018

(65) Prior Publication Data
US 2019/0087719 A1    Mar. 21, 2019

Related U.S. Application Data

(60) Provisional application No. 62/561,623, filed on Sep. 21, 2017.

(51) Int. Cl.
*G06N 3/063* (2006.01)
*G06N 3/08* (2006.01)
(Continued)

(52) U.S. Cl.
CPC .......... *G06N 3/0635* (2013.01); *G06N 3/082* (2013.01); *G11C 7/1006* (2013.01); *G11C 7/16* (2013.01);
(Continued)

(58) Field of Classification Search
CPC .................................................. G06N 3/0635
See application file for complete search history.

(56) References Cited

U.S. PATENT DOCUMENTS 8,712,940 B2 * 4/2014 Modha .................... G06N 3/04
706/26
9,401,366 B1 * 7/2016 Lu ....................... H01L 27/1052
(Continued)

FOREIGN PATENT DOCUMENTS

WO    2017190089 A1    11/2017
WO    2018022821 A1    2/2018
WO    2018057749 A1    3/2018

OTHER PUBLICATIONS

Courbariaux, M. et al., "'Binarized Neural Networks: Training Neural Networks with Weights andActivations Constrained to +1 or−1,'" arXiv:1602.02830v3, Mar. 17, 2016, 11 pages.
(Continued)

*Primary Examiner* — Douglas King
(74) *Attorney, Agent, or Firm* — Withrow & Terranova, P.L.L.C.

(57) ABSTRACT

A static random-access memory (SRAM) system includes SRAM cells configured to perform exclusive NOR operations between a stored binary weight value and a provided binary input value. In some embodiments, SRAM cells are configured to perform exclusive NOR operations between a stored binary weight value and a provided ternary input value. The SRAM cells are suitable for the efficient implementation of emerging deep neural network technologies such as binary neural networks and XNOR neural networks.

11 Claims, 4 Drawing Sheets

(51) Int. Cl.
    *G11C 11/54*   (2006.01)
    *G11C 7/10*    (2006.01)
    *G11C 7/16*    (2006.01)
    *G11C 27/00*   (2006.01)
    *G11C 11/419*  (2006.01)
    *G11C 11/412*  (2006.01)
    *G11C 11/413*  (2006.01)
    *G11C 8/14*    (2006.01)
    *G11C 7/18*    (2006.01)
    *G06N 3/04*    (2006.01)

(52) U.S. Cl.
    CPC .......... *G11C 11/412* (2013.01); *G11C 11/413* (2013.01); *G11C 11/419* (2013.01); *G11C 11/54* (2013.01); *G11C 27/005* (2013.01); *G06N 3/0454* (2013.01); *G11C 7/18* (2013.01); *G11C 8/14* (2013.01)

(56) References Cited

U.S. PATENT DOCUMENTS

| | | | |
|---|---|---|---|
| 9,466,362 B2 | 10/2016 | Yu et al. | |
| 9,934,463 B2 | 4/2018 | Seo et al. | |
| 10,628,732 B2 * | 4/2020 | Brezzo | G06N 3/049 |
| 2007/0279965 A1 * | 12/2007 | Nakazato | G11C 11/4125 365/154 |
| 2010/0103719 A1 * | 4/2010 | Lee | G11C 11/412 365/154 |
| 2017/0300815 A1 | 10/2017 | Seo | |
| 2019/0080755 A1 | 3/2019 | Seo et al. | |
| 2019/0150794 A1 | 5/2019 | Vrudhula et al. | |
| 2019/0164538 A1 | 5/2019 | Seo et al. | |
| 2019/0244100 A1 | 8/2019 | Seo et al. | |

OTHER PUBLICATIONS

Hubara, I. et al., "Binarized Neural Networks," 30th Conference on Neural Information Processing Systems (NIPS 2016), 2016, Barcelona, Spain, 9 pages.

Rastegari, M. et al., "XNOR-Net: ImageNet: Classification Using Binary Convolutional Neural Networks," Proceedings of the 14th European Conference on Computer Vision (ECCV 2016), Part IV, LNCS 9908, Oct. 2016, Amsterdam, The Netherlands, Springer International Publishing AG, pp. 525-542.

Zhou, S. et al., "DoReFa-Net: Training Low Bitwidth Convolutional Neural Networks with Low Bitwidth Gradients," arXiv: 1606.06160v2, Jul. 17, 2016, 14 pages.

* cited by examiner

STATIC RANDOM-ACCESS MEMORY FOR DEEP NEURAL NETWORKS

RELATED APPLICATIONS

This application claims the benefit of provisional patent application Ser. No. 62/561,623, filed Sep. 21, 2017, the disclosure of which is hereby incorporated herein by reference in its entirety.

FIELD OF THE DISCLOSURE

The present disclosure relates to static random-access memory and in particular to static random-access memory architectures suitable for use in deep neural networks.

BACKGROUND

Deep neural networks and in particular convolutional neural networks are being used with increasing frequency for a number of tasks such as image classification, image clustering, and object recognition. In a forward propagation of a conventional convolutional neural network, a kernel is passed over one or more tensors to produce one or more feature maps. At a particular location of the kernel within a tensor, each of a number of input values in the tensor operated on by the kernel are multiplied by a corresponding weight value in the kernel and summed via addition and subtraction to produce a single value of a feature map. Accordingly, a conventional convolutional neural network requires multiplication, addition, and subtraction. Implementing a conventional convolutional neural network requires a large amount of computing power, and the technology has thus been unavailable for mobile and low-power devices such as those for the Internet of Things.

Recent work in the field has focused on reducing the necessary computing power for implementing convolutional neural networks. A first approach, referred to as a "binary neural network," uses binary weight values in the kernel. By converting the weight values in the kernel to binary values, a forward propagation of the binary neural network can be computed using only addition and subtraction. Foregoing the need for multiplication during forward propagation may result in a 2× savings in computing power. Further, storing binary weight values instead of real weight values may produce a 32× savings in memory. Finally, using binary weight values results in minimal if any impact on the accuracy of the binary neural network.

An additional approach, referred to as an "XNOR neural network," uses binary input values in the tensors and binary weight values in the kernel. By converting the input values in the tensors and the weight values in the kernel to binary values, a forward propagation of the XNOR neural network can be computed using only an exclusive nor (XNOR) operation and a bit count operation, where a bit count operation is simply a count of the number of high bits in a given stream of binary values. Using an XNOR operation and a bit count operation instead of multiplication, addition, and subtraction may result in a 58× savings in computing power. Further, storing binary input values instead of real input values and binary weight values instead of real weight values may produce a 32× savings in memory. While using binary input values and binary weight values does reduce the accuracy of the XNOR neural network, the results are often still acceptable for use.

XNOR neural networks in particular have opened the possibility of implementation on mobile and other low-power devices. However, conventional computing systems are not well suited for the efficient implementation of these XNOR neural networks. Accordingly, there is a need for computing systems, and in particular memory architectures, capable of efficiently supporting the operation of XNOR neural networks for improvements in speed and efficiency.

SUMMARY

In one embodiment, a static random-access memory (SRAM) system includes an SRAM cell having a first word line, a second word line, a first bit line, a second bit line, a first inverter, a second inverter, a first switching element, a second switching element, a third switching element, and a fourth switching element. The first inverter includes an input coupled to a first intermediate node and an output coupled to a second intermediate node. The second inverter includes an input coupled to the second intermediate node and an output coupled to the first intermediate node. The first switching element includes a control node coupled to the first word line, a first switching node coupled to the first bit line, and a second switching node coupled to the first intermediate node. The second switching element includes a control node coupled to the first word line, a first switching node coupled to the second bit line, and a second switching node coupled to the second intermediate node. The third switching element includes a control node coupled to the second word line, a first switching node coupled to the first bit line, and a second switching node coupled to the second intermediate node. The fourth switching element includes a control node coupled to the second word line, a first switching node coupled to the second word line, and a second switching node coupled to the first intermediate node.

In one embodiment, the SRAM system further includes memory control circuitry coupled to the SRAM cell and configured to write a binary weight value to the SRAM cell, provide a signal representative of a binary input value to the first word line, and provide a signal representative of a complement of the binary input value to the second word line. In response to the signals provided at the first word line and the second word line, the SRAM cell provides a signal at the first bit line representative of a binary output value and a signal at the second bit line representative of a complement of the binary output value.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
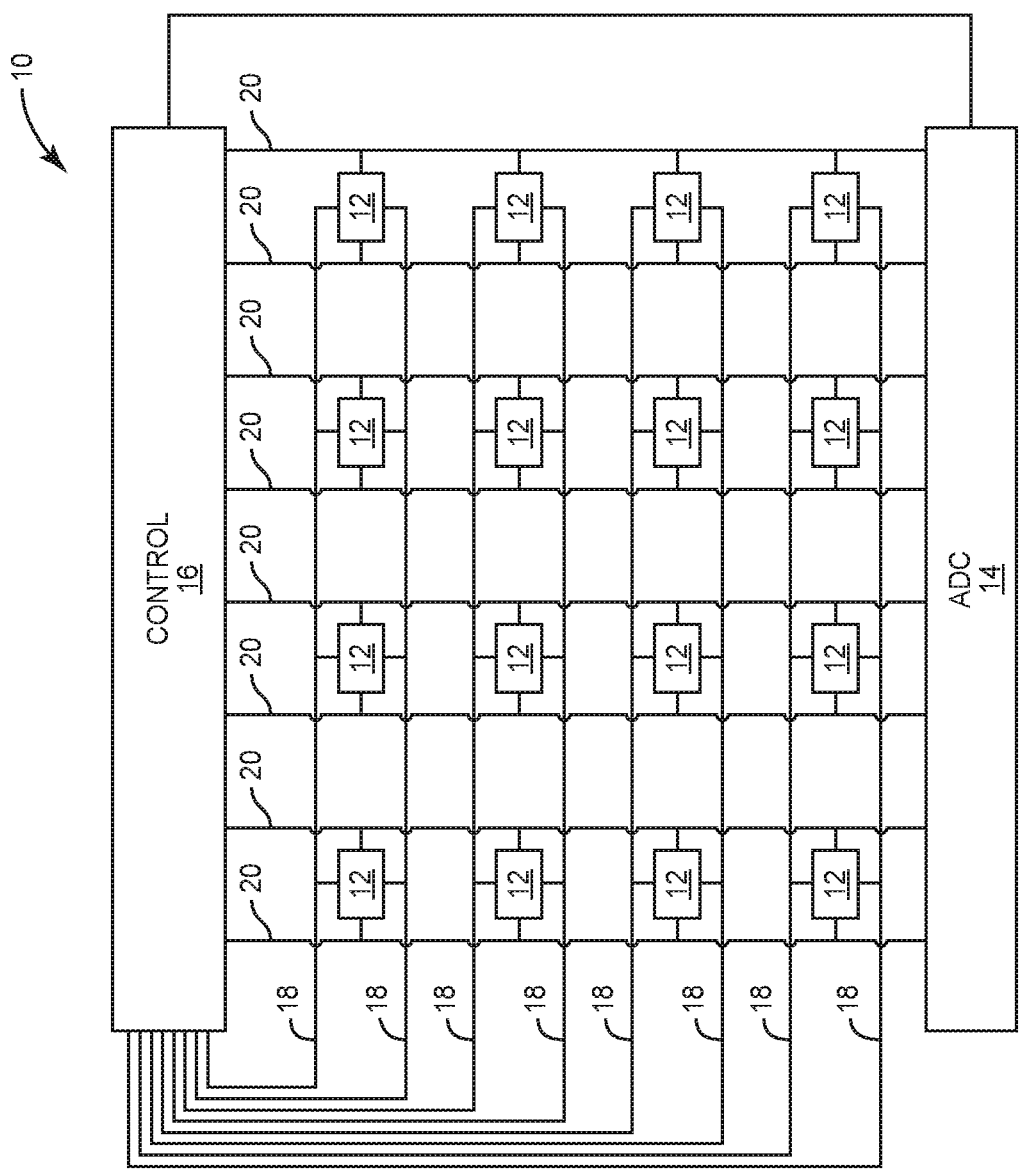
FIG. 1 illustrates a static random-access memory (SRAM) system according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a static random-access memory (SRAM) memory system 10 according to one embodiment of the present disclosure. The SRAM system 10 includes an array of SRAM cells 12, analog-to-digital converter (ADC) circuitry 14, and memory control circuitry 16. The SRAM cells 12 are each coupled between a matrix of word lines 18 and bit lines 20. The memory control circuitry 16 is coupled to each one of the word lines 18 and the bit lines 20. The ADC circuitry 14 is also coupled to the bit lines 20. In operation, the memory control circuitry 16 provides signals to each one of the word lines 18 and each one of the bit lines 20 to read and write values to and from the SRAM cells 12.

Notably, while a select number of SRAM cells 12 are shown for illustration, those skilled in the art will appreciate that the SRAM system 10 may include any number of SRAM cells 12 without departing from the principles of the present disclosure. Further, while the memory control circuitry 16 is shown as a single block in FIG. 1, those skilled in the art will appreciate that the memory control circuitry 16 may include multiple discrete parts, each of which is designed to perform a specific portion of the functionality described herein.

In a conventional memory architecture, each one of the SRAM cells 12 is configured to store a binary value (a single binary bit). These binary values may only be written to and read from each one of the SRAM cells 12 only in specific sub-groups (i.e., pages) thereof. Further, no operations are performed on the binary values written to and read from the SRAM cells 12. The foregoing limitations make conventional memory architectures highly inefficient for use with emerging deep neural network technologies such as binary neural networks or XNOR neural networks as discussed above.

Figure 2:
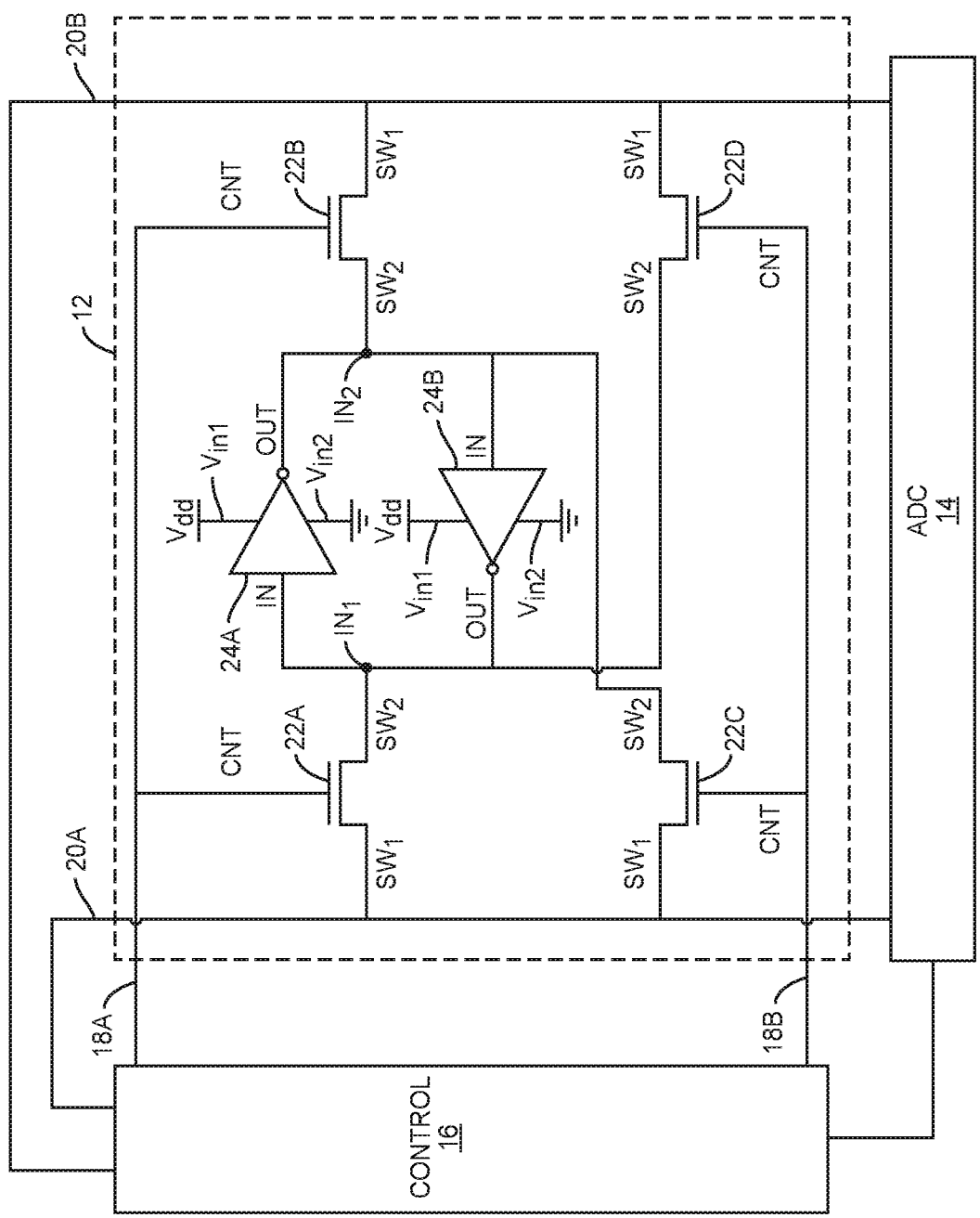
FIG. 2 illustrates an SRAM cell according to one embodiment of the present disclosure.

To address these shortcomings of conventional SRAM systems, FIG. 2 shows details of an SRAM cell 12 according to one embodiment of the present disclosure. The ADC circuitry 14 and the memory control circuitry 16 are also shown for context. The SRAM cell 12 includes a first word line 18A, a second word line 18B, a first bit line 20A, a second bit line 20B, a first switching element 22A, a second switching element 22B, a third switching element 22C, a fourth switching element 22D, a first inverter 24A, and a second inverter 24B. The first switching element 22A includes a control node CNT coupled to the first word line 18A, a first switching node $SW_1$ coupled to the first bit line 20A, and a second switching node $SW_2$ coupled to a first intermediate node $IN_1$. The second switching element 22B includes a control node CNT coupled to the first word line 18A, a first switching node $SW_1$ coupled to the second bit line 20B, and a second switching node $SW_2$ coupled to a second intermediate node $IN_2$. The first inverter 24A includes an input IN coupled to the first intermediate node $IN_1$ and an output OUT coupled to the second intermediate node $IN_2$. Further, the first inverter 24A includes a first voltage input node $V_{in1}$ coupled to a supply voltage $V_{dd}$ and a second voltage input node $V_{in2}$ coupled to a fixed voltage such as ground. The second inverter 24B includes an input IN coupled to the second intermediate node $IN_2$ and an output OUT coupled to the first intermediate node $IN_1$. Further, the second inverter 24B includes a first voltage input node $V_{in1}$ coupled to the supply voltage $V_{dd}$ and a second voltage input node $V_{in2}$ coupled to a fixed voltage such as ground. The third switching element 22C includes a control node CNT coupled to the second word line 18B, a first switching node $SW_1$ coupled to the first bit line 20A, and a second switching node $SW_2$ coupled to the second intermediate node $IN_2$. The fourth switching element 22D includes a control node CNT coupled to the second word line 18B, a first switching node $SW_1$ coupled to the second bit line 20B, and a second switching node $SW_2$ coupled to the first intermediate node $IN_1$.

In operation, the memory control circuitry 16 writes a binary weight value to the SRAM cell 12 by providing a signal at the first word line 18A sufficient to activate the first switching element 22A (i.e., cause the first switching element 22A to couple the first bit line 20A to the first intermediate node $IN_1$) and providing a signal at the first bit line 20B representative of the binary weight value. As discussed herein, a binary high value is represented as the supply voltage $V_{dd}$, while a binary low value is represented as ground. However, those skilled in the art will readily appreciate that binary values may be represented by a variety of different signals, all of which are contemplated herein. In some embodiments, the memory control circuitry 16 may write the binary weight value to the SRAM cell 12 by providing a signal at the first word line 18A sufficient to activate the first switching element 22A and the second switching element 22B (i.e., cause the first switching element 22A to couple the first bit line 20A to the first intermediate node $IN_1$ and cause the second switching element 22B to couple the second bit line 20B to the second intermediate node $IN_2$—this signal may be equal to the supply voltage $V_{dd}$ in some embodiments), providing a signal at the first bit line 20A representative of the binary weight value, and providing a signal at the second bit line 20B indicative of a complement of the binary weight value. Writing the binary weight value to the SRAM cell 12 in this manner may reduce write times.

When a signal below a threshold value of the inverters 24 is provided at the input IN thereof, the inverters 24 provide the voltage at the first voltage input node $V_{in1}$ (in this case, the supply voltage $V_{dd}$) at the output OUT thereof. When a signal above the threshold value of the inverters 24 is provided at the input IN thereof, the inverters 24 provide the voltage at the second voltage input node $V_{in2}$ (in this case, ground) at the output thereof. Once the SRAM cell 12 is written to, the inverters 24 continue to invert the signal provided at the input IN thereof in a circular fashion, thereby storing the binary weight value as long as the supply voltage $V_{dd}$ continues to be provided.

The memory control circuitry 16 may facilitate a read operation by providing a signal indicative of a binary input value at the first word line 18A and providing a signal indicative of a complement of the binary input value at the second word line 18B. A binary high value of the binary input value will activate (i.e., couple the first switching node $SW_1$ to the second switching node $SW_2$) the switching elements 22 coupled to the word line 18 on which it is provided, while a binary low value will cause the switching elements 22 coupled to the word line 18 on which it is provided to remain deactivated (i.e., the first switching node $SW_1$ remains decoupled from the second switching node $SW_2$). In response to the signal indicative of the binary input value at the first word line 18A and the signal indicative of the complement of the binary input value at the second word line 18B, the SRAM cell 12 provides a signal at the first bit line 20A indicative of a binary output value, where the binary output value is equal to an exclusive NOR of the binary input value and the binary weight value and provides a signal at the second bit line 20B indicative of a complement of the binary output value. The ADC circuitry 14 may receive the signal at the first bit line 20A and the second bit line 20B.

As a first example, when the binary weight value is a binary low value, the first intermediate node $IN_1$ is coupled to ground and the supply voltage $V_{dd}$ is provided at the second intermediate node $IN_2$. When the binary input value is also a binary low value, the first word line 18A is coupled to ground and the supply voltage $V_{dd}$ is provided at the second word line 18B. This causes the first switching element 22A and the second switching element 22B to remain deactivated (i.e., the first switching node $SW_1$ remains decoupled from the second switching node $SW_2$) and causes the third switching element 22C and the fourth switching element 22D to activate (i.e., couple the first switching element $SW_1$ to the second switching element $SW_2$). Accordingly, the supply voltage at the second intermediate node $IN_2$ is provided to the first bit line 20A and the second bit line 20B is coupled to ground. As discussed above, the signal provided at the first bit line 20A is indicative of a binary output value, which is equal to an exclusive NOR of the binary input value and the binary weight value. In this example, the binary input value is a binary low value and the binary weight value is a binary low value, resulting in a binary output value that is a binary high value, which is consistent with an exclusive NOR of the binary input value and the binary weight value.

As a second example, when the binary weight value is a binary low value, once again the the first intermediate node $IN_1$ is coupled to ground and the supply voltage $V_{dd}$ is provided at the second intermediate node $IN_2$. When the binary input value is a binary high value, the supply voltage $V_{dd}$ is provided at the first word line 18A and the second word line 18B is coupled to ground. This causes the first switching element 22A and the second switching element 22B to activate (i.e., couple the first switching node $SW_1$ to the second switching node $SW_2$) and the third switching element 22C and the fourth switching element 22D to remain deactivated (i.e., the first switching node $SW_1$ remains decoupled from the second switching node $SW_2$). Accordingly, the first bit line 20A is coupled to ground and the supply voltage $V_{dd}$ is provided to the second bit line 20B. As discussed above, the signal provided at the first bit line 20A is indicative of a binary output value, which is equal to an exclusive NOR of the binary input value and the binary weight value. In this example, the binary input value is a binary high value and the binary weight value is a binary low value, resulting in a binary output value that is a binary low value, which is again consistent with an exclusive NOR of the binary input value and the binary weight value. Those skilled in the art will readily appreciate the operating result when the binary input value is a binary high value and the binary weight value is a binary high value (a binary high value) and when the binary input value is a binary low value and the binary weight value is a binary high value (a binary low value).

The result of a read operation on the SRAM cell 12 can be thought of in two ways. If considering a binary high value as 1 and a binary low value as 0, the result of a read operation on the SRAM cell 12 can be thought of as an exclusive NOR between the binary input value and the binary weight value. If considering a binary high value as a +1 and a binary low value as a −1, the result of a read operation on the SRAM cell 12 can be thought of as a multiplication of the binary input value and the binary weight value. Those skilled in the art will readily appreciate that the emerging deep neural network technologies discussed above often represent binary values as +1 and −1 rather than 0 and 1 as a means to replace costly multiplication operations with more economical bitwise operations. The SRAM system 10 accordingly allows for the efficient implementation of these emerging deep neural network technologies, as it is capable of representing binary numbers in this way.

As shown in FIG. 2, the first switching element 22A, the second switching element 22B, the third switching element 22C, and the fourth switching element 22D are transistors, and specifically metal-oxide semiconductor field-effect transistors (MOSFETs). However, those skilled in the art will readily appreciate that the first switching element 22A, the second switching element 22B, the third switching element 22C, and the fourth switching element 22D may be any type of switching elements without departing from the principles described herein. In some embodiments, the second word line 18B may be removed, with the third switching element 22C and the fourth switching element 22D being replaced by PMOS transistors that are controlled in a complementary fashion with the first switching element 22A and the second switching element 22B by the first word line 18A. The first switching element 22A, the second switching element 22B, the third switching element 22C, the fourth switching element 22D, the first inverter 24A, and the second inverter 24B may be complementary metal-oxide semiconductor (CMOS) devices in some embodiments. Those skilled in the art will readily appreciate the internal workings of the first inverter 24A and the second inverter 24B, and thus the details thereof are not shown to avoid obscuring the drawings.

By operating the SRAM cell 12 as discussed above, XNOR/multiplication operations may be performed between binary input values and binary weight values in a highly efficient manner. Further, the above read process may be performed simultaneously for all SRAM cells 12 located in a column in the SRAM system 10 shown in FIG. 1. As shown above in FIG. 1, each one of the SRAM cells 12 located in a column share the first bit line 20A and the second bit line 20B. The memory control circuitry 16 may simultaneously perform the read operation discussed above for all SRAM cells 12 in a column, such that the signals from each SRAM cell 12 in the column accumulate on the first bit line 20A and the second bit line 20B. The ADC circuitry 14 may convert these accumulated signals to a value that is indicative of a bitcount of the exclusive NOR of the binary input values and binary weight values for each respective SRAM cell 12. As discussed herein, a bitcount is simply a count of the number of binary high values in a binary stream. Accordingly, if a column includes four SRAM cells 12 and two of them are binary high values, the bitcount of the output of the four SRAM cells 12 will be two. This results in a highly efficient read process for the SRAM system 10.

Figure 3:
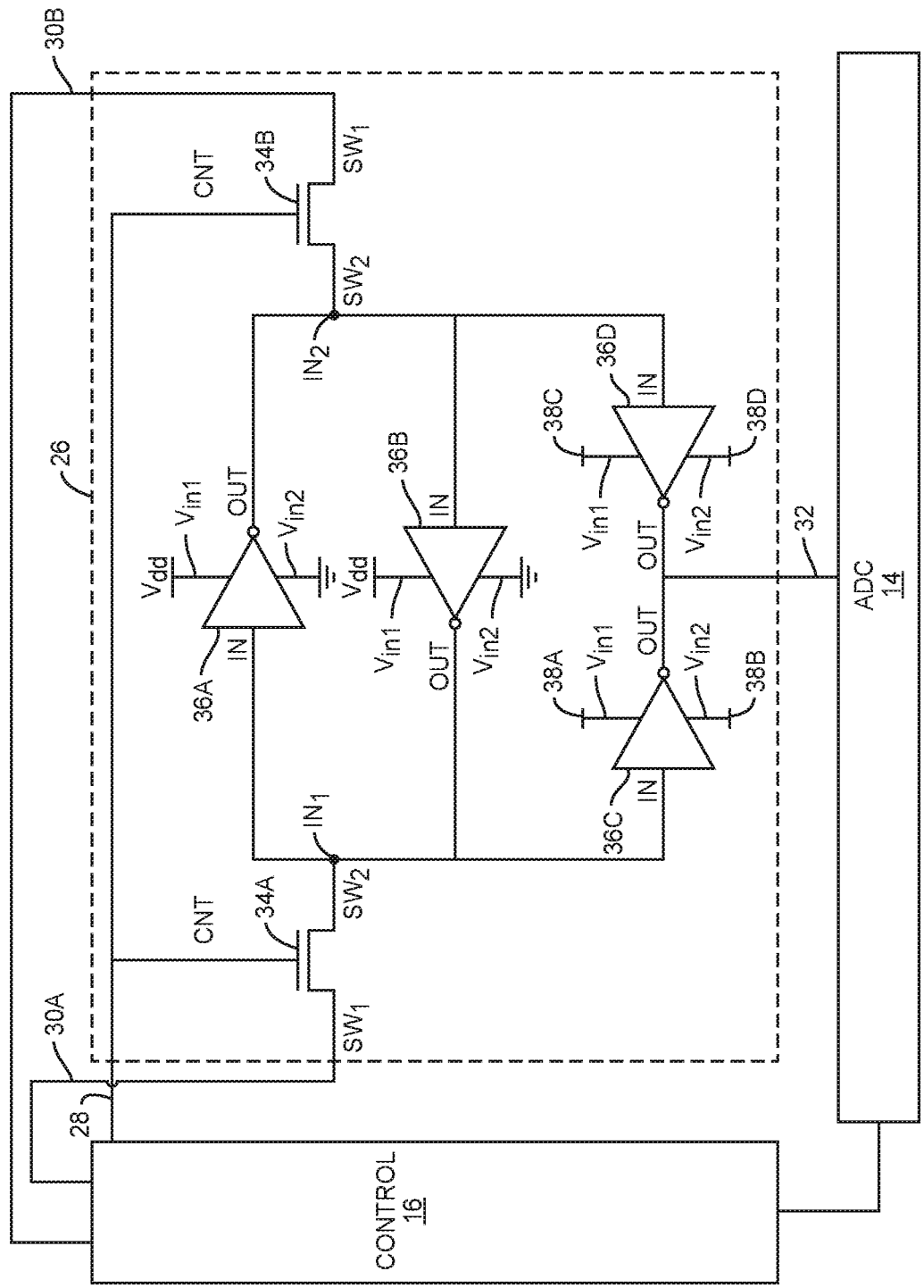
FIG. 3 illustrates an SRAM cell according to an additional embodiment of the present disclosure.

In some situations, it may be beneficial to quantize the binary input values into ternary rather than binary values such that the exclusive NOR operation also results in a ternary output value. Accordingly, FIG. 3 shows a ternary input SRAM cell 26 according to one embodiment of the present disclosure. The ADC circuitry 14 and the memory control circuitry 16 are also shown for context. The ternary input SRAM cell 26 includes a write word line 28, a first write bit line 30A, a second write bit line 30B, a read bit line 32, a first switching element 34A, a second switching element 34B, a first inverter 36A, a second inverter 36B, a third inverter 36C, a fourth inverter 36D, a first read word line 38A, a second read word line 38B, a third read word line 38C, and a fourth read word line 38D. The first switching element 34A includes a control node CNT coupled to the write word line 28, a first switching node $SW_1$ coupled to the first write bit line 30A, and a second switching node $SW_2$ coupled to a first intermediate node $IN_1$. The second switching element 34B includes a control node CNT coupled to the write word line 28, a first switching node $SW_1$ coupled to the second write bit line 30B, and a second switching node $SW_2$ coupled to a second intermediate node $IN_2$. The first inverter 36A includes an input IN coupled to the first intermediate node $IN_1$ and an output OUT coupled to the second intermediate node $IN_2$. Further, the first inverter 36A includes a first voltage input node $V_{in1}$ coupled to a supply voltage $V_{dd}$ and a second voltage input node $V_{in2}$ coupled to a fixed voltage (e.g., ground). The second inverter 36B includes an input IN coupled to the second intermediate node $IN_2$ and an output OUT coupled to the first intermediate node $IN_1$. Further, the second inverter 36B includes a first voltage input node $V_{in1}$ coupled to the supply voltage $V_{dd}$ and a second voltage input node $V_{in2}$ coupled to a fixed voltage (e.g., ground). The third inverter 36C includes an input IN coupled to the first intermediate node $IN_1$ and an output OUT coupled to the read bit line 32. Further, the third inverter 36C includes a first voltage input node $V_{in1}$ coupled to the first read word line 38A and a second voltage input node $V_{in2}$ coupled to the second read word line 38B. The fourth inverter 36D includes an input IN coupled to the second intermediate node $IN_2$ and an output OUT coupled to the read bit line 32. Further, the fourth inverter 36D includes a first voltage input node $V_{in1}$ coupled to the third read word line 38C and a second voltage input node $V_{in2}$ coupled to the fourth read word line 38D. The ternary input SRAM cell 26 can be readily substituted for the SRAM cells 12 in the SRAM system 10 shown in FIG. 1. While FIG. 1 does not illustrate the additional word lines and bit lines in the ternary input SRAM cell 26 coupled to the memory control circuitry, those skilled in the art will readily understand how those connections could be made.

As discussed above, each one of the inverters 36 is configured to receive a signal at the input IN thereof. If the signal provided at the input IN is below a threshold level of the inverter 36, the inverter 36 is configured to provide the voltage at the first voltage input node $V_{in1}$ at the output OUT thereof. If the signal provided at the input IN is above a threshold level of the inverter 36, the inverter 36 is configured to provide the voltage at the second voltage input node $V_{in2}$ at the output thereof.

In operation, the memory control circuitry 16 writes a binary weight value to the ternary input SRAM cell 26 by providing a signal at the write word line 28 sufficient to activate the first switching element 34A (i.e., cause the first switching element 22A to couple the first write bit line 30A to the first intermediate node $IN_1$) and providing a signal to the first write bit line 30A representative of the binary weight value. As discussed herein, a binary high value is represented as the supply voltage $V_{dd}$, while a binary low value is represented as ground. However, those skilled in the art will readily appreciate that binary values may be represented by a variety of different signals, all of which are contemplated herein. In some embodiments, the memory control circuitry 16 may write the binary weight value to the ternary input SRAM cell 26 by providing a signal at the write word line 28 sufficient to activate the first switching element 34A and the second switching element 34B (i.e., cause the first switching element 34A to couple the first write bit line 30A to the first intermediate node $IN_1$ and cause the second switching element 34B to couple the second write bit line 30B to the second intermediate node $IN_2$), providing a signal at the first write bit line 30A representative of the binary weight value, and providing a signal at the second write bit line 30B representative of a complement of the binary weight value. Writing the binary weight value to the ternary input SRAM cell 26 in this manner may reduce write times.

The memory control circuitry 16 may facilitate a read operation by providing signals indicative of a ternary input signal at the first read word line 38A, the second read word line 38B, the third read word line 38C, and the fourth read word line 38D. The ternary states may be represented as described below in Table 1:

|  | High | Low | Other |
|---|---|---|---|
| First read word line 38A | $V_{dd}$ | Ground | $V_{dd}$ |
| Second read word line 38B | Ground | $V_{dd}$ | Ground |
| Third read word line 38C | Ground | $V_{dd}$ | $V_{dd}$ |
| Fourth read word line 38D | $V_{dd}$ | Ground | Ground |

In response to providing the signals at the first read word line 38A, the second read word line 38B, the third read word line 38C, and the fourth read word line 38D, the third inverter 36C and the fourth inverter 36D provide a signal at the read bit line 32 representative of a ternary output value, wherein the ternary output value is equal to the ternary input value multiplied by the binary weight value.

As a first example, when the ternary input value is a ternary high value, the supply voltage $V_{dd}$ is provided at the first read word line 38A and the fourth read word line 38D while the second read word line 38B and the third read word line 38C are coupled to ground. Further, when the binary weight value is a binary low value, the first intermediate node $IN_1$ is coupled to ground while the supply voltage $V_{dd}$ is provided at the second intermediate node $IN_2$. Accordingly, the third inverter 36C and the fourth inverter 36D provide the supply voltage $V_{dd}$ at the read bit line 32 as discussed in detail below.

Figure 4:
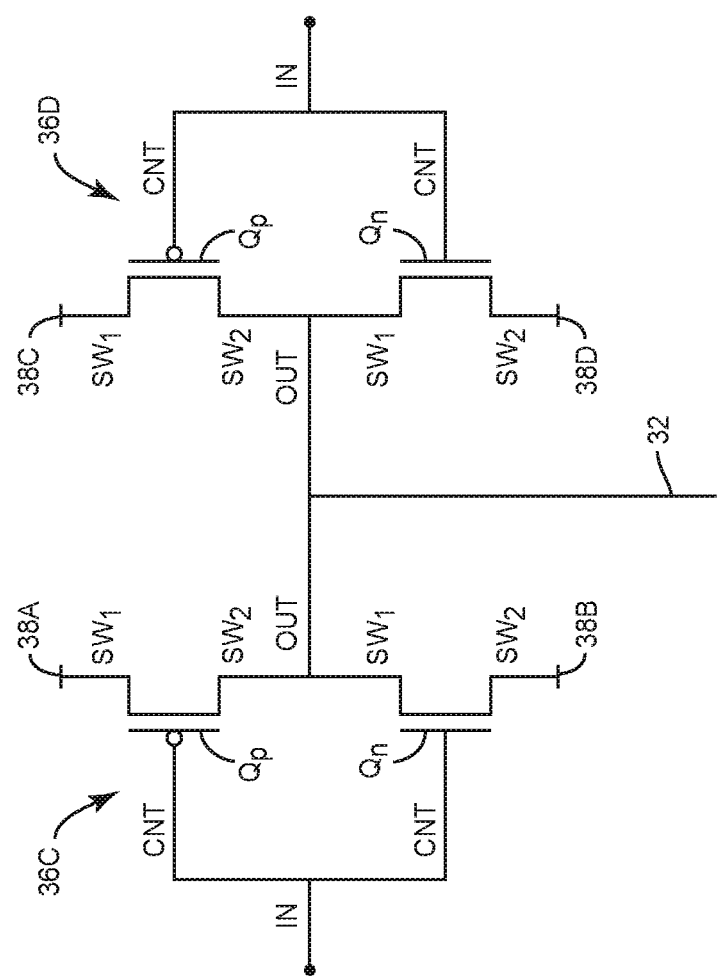
FIG. 4 illustrates details of an SRAM cell according to on embodiment of the present disclosure.

To further illustrate details of this configuration, FIG. 4 shows details of the third inverter 36C and the fourth inverter 36D. As shown, the third inverter 36C includes a PMOS transistor $Q_p$ including a control node CNT coupled to the input IN, a first switching node $SW_1$ coupled to the first read word line 38A, and a second switching node $SW_2$ coupled to the output OUT. Further, the third inverter 36C includes an NMOS transistor $Q_n$ including a control node CNT coupled to the input IN, a first switching node $SW_1$ coupled to the output OUT, and a second switching node $SW_2$ coupled to the second read word line 38B. The fourth inverter 36D includes a PMOS transistor $Q_p$ including a control node CNT coupled to the input IN, a first switching node $SW_1$ coupled to the third read word line 38C, and a second switching node $SW_2$ coupled to the output OUT. Further, the fourth inverter 36D includes an NMOS transistor $Q_n$ including a control node CNT coupled to the input IN, a first switching node $SW_1$ coupled to the output OUT, and a second switching node $SW_2$ coupled to the fourth read word line 38D. The PMOS transistor $Q_p$ and the NMOS transistor $Q_n$ of each one of the third inverter 36C and the fourth inverter 36D are operated in a complementary fashion such that when one is activated, the other is deactivated, and vice versa.

In the first example discussed above, the PMOS transistor $Q_p$ of the third inverter 36C is strongly activated while the NMOS transistor $Q_n$ of the third inverter 36C remains deactivated. Further, the NMOS transistor $Q_n$ of the fourth inverter 36D is weakly activated while the PMOS transistor $Q_p$ of the fourth inverter 36D remains deactivated. Accordingly, there is a strong pull-up path to the supply voltage $V_{dd}$ through the third inverter 36C and a weak pull-down path to the supply voltage $V_{dd}$ through the fourth inverter 36D at the read bit line 32. This state reflects a ternary low value.

As a second example, when the ternary input value is a ternary low value, the supply voltage $V_{dd}$ is provided at the second read word line 38B and the third read word line 38C while the first read word line 38A and the fourth read word line 38D are coupled to ground. Further, when the binary weight value is a binary low value, the first intermediate node $IN_1$ is coupled to ground while the supply voltage $V_{dd}$ is provided at the second intermediate node $IN_2$. Accordingly, the third inverter 36C and the fourth inverter 36D couple the read bit line 32 to ground as discussed in detail below.

Referring once again to FIG. 4, in the present example the PMOS transistor $Q_p$ of the third inverter 36C is strongly activated while the NMOS transistor $Q_n$ of the third inverter 36C remains deactivated. Further, the NMOS transistor $Q_n$ of the fourth inverter 36D is weakly activated while the PMOS transistor $Q_p$ of the fourth inverter 36D remains deactivated. Accordingly, there is a strong pull-up path to ground through the third inverter 36C and a weak pull-down path to ground via the fourth inverter 36D. This state reflects a ternary high value.

As a third example, when the ternary input value is a ternary other value, the supply voltage $V_{dd}$ is provided at the first read word line 38A and the third read word line 38C while the second read word line 38B and the fourth read word line 38D are coupled to ground. Further, when the binary weight value is a binary low value, the first intermediate node $IN_1$ is coupled to ground while the supply voltage $V_{dd}$ is provided at the second intermediate node $IN_2$. Accordingly, the third inverter 36C provides a portion of the supply voltage $V_{dd}$ to the read bit line 32 while the fourth inverter 36D partially couples the read bit line 32 to ground as discussed below.

Referring once again to FIG. 4, in the present example, the PMOS transistor $Q_p$ of the third inverter 36C is strongly activated while the NMOS transistor $Q_n$ of the third inverter 36C remains deactivated. Further, the NMOS transistor $Q_n$ of the fourth inverter 36D is strongly activated while the PMOS transistor $Q_p$ of the fourth inverter 36D remains deactivated. Accordingly, there is a strong pull-up path to the supply voltage $V_{dd}$ through the third inverter 36C and a strong pull-down path to ground via the fourth inverter 36D. This state reflects a ternary other value.

Those skilled in the art will readily appreciate the operating result when the ternary input value is a ternary high value and the binary weight value is a binary high value (a ternary high value), when the ternary input value is a ternary low value and the binary weight value is a binary high value (a ternary low value), and when the ternary input value is a ternary other value and the binary weight value is a binary high value (a ternary other value).

The result of a read operation of the ternary input SRAM cell 26 can be thought of in two ways. If considering a binary high value as 1, a binary low value as 0, a ternary high value as 1, a ternary low value as 0, and a ternary other value as 2, the result of a read operation on the ternary input SRAM cell 26 can be thought of as an exclusive NOR between the ternary input value and the binary weight value. If considering a binary high value as a +1, a binary low value as a −1, a ternary high value as a +1, a ternary low value as a −1, and a ternary other value as a 0, the result of a read operation on the ternary input SRAM cell 26 can be thought of as a multiplication of the ternary input value and the binary weight value. Those skilled in the art will readily appreciate that the emerging deep neural network technologies discussed above often represent binary numbers as +1 and −1 rather than as 0 and 1 as a means to replace costly multiplication operations with more economical bitwise operations. The SRAM system 10 accordingly allows for the efficient implementation of these emerging deep neural network technologies, as it is capable of representing binary numbers in this way.

As shown in FIG. 3, the first switching element 34A and the second switching element 34B are transistors, and specifically MOSFETs. However, those skilled in the art will readily appreciate that the first switching element 34A and the second switching element 34B may be any type of switching elements without departing from the principles described herein. The first switching element 34A, the second switching element 34B, the first inverter 36A, the second inverter 36B, the third inverter 36C, and the fourth inverter 36D may be CMOS devices in some embodiments. Those skilled in the art will readily appreciate the internal working of the first inverter 36A and the second inverter 36B and thus the details thereof are not shown to avoid obscuring the drawings. In FIG. 4, the PMOS transistor $Q_p$ and the NMOS transistor $Q_n$ of each one of the third inverter 36C and the fourth inverter 36D may be MOSFETs.

By operating the ternary input SRAM cell 26 as discussed above, XNOR/multiplication operations may be performed between binary input values and binary weight values in a highly efficient manner. Further, the above read process may be performed simultaneously for all ternary input SRAM cells 26 located in a column in the SRAM system 10 shown in FIG. 1. As shown above in FIG. 1, each one of the ternary input SRAM cells 26 (shown simply as SRAM cells 12) located in a column share the read bit line 32. The memory control circuitry 16 may simultaneously perform the read operation discussed above for all ternary input SRAM cells 26 in a column, such that the signals from each ternary input SRAM cell 26 in the column accumulate on the read bit line 32. The ADC circuitry 14 may convert these accumulated signals to a value that is indicative of a bitcount of the exclusive NOR of the ternary input values and the binary weight values for each respective ternary input SRAM cell 26.

In the ideal scenario, a ternary other value is represented as being exactly half-way between a ternary high value and a ternary low value. Referring to FIG. 4 above, a ternary other value would thus ideally be represented by a half-strength pull-up path to the supply voltage $V_{dd}$ and a half-strength pull-down path to ground, or vice-versa. However, this is not easily accomplished without significantly complicating the design of the ternary input SRAM cell 26. The fact that the ternary other value is not ideally represented in the SRAM system 10 may complicate the analog-to-digital conversion of the accumulated signals on the read bit line 32 in some situations. Accordingly, the ternary input value may be represented as a ternary other value differently in different rows of the SRAM system 10. In one exemplary embodiment, for ternary input SRAM cells 26 in even rows of the SRAM system 10, the ternary input value may be represented as a ternary other value by providing the supply voltage $V_{dd}$ at the first read word line 38A and the third read word line 38C while the second read word line 38B and the fourth read word line 38D are coupled to ground. For ternary input SRAM cells 26 in odd rows of the SRAM system 10, the ternary input value may be represented as a ternary other value by coupling the first read word line 38A and the third read word line 38C to ground and providing the supply voltage $V_{dd}$ at the second read word line 38B and the fourth read word line 38D. Assuming a random distribution of ternary input values, representing ternary other values in this manner averages the effect of ternary other values on the read bit line 32 in each column, thus more closely approximating the ideal ternary other value as halfway between the ternary high value and the ternary low value. This in turn makes it easier to accurately convert the accumulated signals on the read bit line 32 to a digital value.

Referring back to FIG. 1, the number of SRAM cells 12 in the SRAM system 10 may affect the required precision of the ADC circuitry 14. In particular, as the number of SRAM cells 12 increases, the precision of the ADC circuitry 14 must also increase. Accordingly, it may be beneficial to provide several arrays of SRAM cells 12 having smaller sizes than one large array of SRAM cells 12.

Those skilled in the art will recognize improvements and modifications to the preferred embodiments of the present disclosure. All such improvements and modifications are considered within the scope of the concepts disclosed herein and the claims that follow.

What is claimed is:

1. A static random-access memory (SRAM) system comprising:
an SRAM cell comprising:
a first word line and a second word line;
a first bit line and a second bit line;
a first inverter comprising an input coupled to a first intermediate node and an output coupled to a second intermediate node;
a second inverter comprising an input coupled to the second intermediate node and an output coupled to the first intermediate node;
a first switching element comprising a control node coupled to the first word line, a first switching node coupled to the first bit line, and a second switching node coupled to the first intermediate node;
a second switching element comprising a control node coupled to the first word line, a first switching node coupled to the second bit line, and a second switching node coupled to the second intermediate node;
a third switching element comprising a control node coupled to the second word line, a first switching node coupled to the first bit line, and a second switching node coupled to the second intermediate node; and
a fourth switching element comprising a control node coupled to the second word line, a first switching node coupled to the second bit line, and a second switching node coupled to the first intermediate node.

2. The SRAM system of claim 1 further comprising:
memory control circuitry coupled to the SRAM cell and configured to:
write a binary weight value to the SRAM cell;
provide a signal representative of a binary input value to the first word line; and
provide a signal representative of a complement of the binary input value to the second word line, wherein in response to the signal representative of the binary input value at the first word line and the signal representative of the complement of the binary input value at the second word line the SRAM cell is configured to provide a signal at the first bit line representative of a binary output value and provide a signal at the second bit line representative of a complement of the binary output value.

3. The SRAM system of claim 2 further comprising analog-to-digital converter (ADC) circuitry coupled to the first bit line and the second bit line and configured to receive the signal representative of the binary output value and the signal representative of the complement of the binary output value and provide a digital output signal representative of the binary output value.

4. The SRAM system of claim 3 wherein the first switching element, the second switching element, the third switching element, and the fourth switching element are transistors.

5. The SRAM system of claim 2 wherein writing the binary weight value to the SRAM cell comprises providing a signal representative of the binary weight value to the input of the first inverter.

6. The SRAM system of claim 1 wherein the first switching element, the second switching element, the third switching element, and the fourth switching element are transistors.

7. A static random-access memory (SRAM) system comprising:
    a plurality of SRAM cells, each comprising:
    a first word line and a second word line;
    a first bit line and a second bit line;
    a first inverter comprising an input coupled to a first intermediate node and an output coupled to a second intermediate node;
    a second inverter comprising an input coupled to the second intermediate node and an output coupled to the first intermediate node;
    a first switching element comprising a control node coupled to the first word line, a first switching node coupled to the first bit line, and a second switching node coupled to the first intermediate node;
    a second switching element comprising a control node coupled to the first word line, a first switching node coupled to the second bit line, and a second switching node coupled to the second intermediate node;
    a third switching element comprising a control node coupled to the second word line, a first switching node coupled to the first bit line, and a second switching node coupled to the second intermediate node; and
    a fourth switching element comprising a control node coupled to the second word line, a first switching node coupled to the second bit line, and a second switching node coupled to the first intermediate node.

8. The SRAM system of claim 7 further comprising:
    memory control circuitry coupled to each of the plurality of SRAM cells and configured to:
    write a binary weight value to each one of the plurality of SRAM cells;
    provide a signal representative of a binary input value to the first word line; and
    provide a signal representative of a complement of the binary input value to the second word line, wherein in response to the signal representative of the binary input value at the first word line and the signal representative of the complement of the binary input value at the second word line each one of the plurality of SRAM cells is configured to provide a signal at the first bit line representative of a binary output value and provide a signal at the second bit line representative of a complement of the binary output value.

9. The SRAM system of claim 8 further comprising analog-to-digital converter (ADC) circuitry coupled to the first bit line and the second bit line and configured to receive the signal representative of the binary output value and the signal representative of the complement of the binary output value from each one of the plurality of SRAM cells and provide a digital output signal representative of a bitwise count of the binary output values of the plurality of SRAM cells.

10. The SRAM system of claim 8 wherein writing the binary weight value to each one of the plurality of SRAM cells comprises providing a signal representative of the binary weight value to the input of the first inverter of each one of the plurality of SRAM cells.

11. The SRAM system of claim 7 wherein the first switching element, the second switching element, the third switching element, and the fourth switching element are transistors.

* * * * *